(12) United States Patent
Hobbs et al.

(10) Patent No.: US 6,818,493 B2
(45) Date of Patent: Nov. 16, 2004

(54) SELECTIVE METAL OXIDE REMOVAL PERFORMED IN A REACTION CHAMBER IN THE ABSENCE OF RF ACTIVATION

(75) Inventors: Christopher C. Hobbs, Austin, TX (US); Philip J. Tobin, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/916,023

(22) Filed: Jul. 26, 2001

(65) Prior Publication Data

US 2003/0022432 A1 Jan. 30, 2003

(51) Int. Cl.$^7$ ............................................. H01L 21/8238
(52) U.S. Cl. ....................... 438/216; 438/287; 438/591; 438/706
(58) Field of Search ................................. 438/216, 261, 438/287, 421, 591, 595, 954, 981, 706, 712, 715; 257/410, 411; 216/67, 76

(56) References Cited

U.S. PATENT DOCUMENTS

| | | | |
|---|---|---|---|
| 4,708,766 A | | 11/1987 | Hynecek |
| 4,834,834 A | * | 5/1989 | Ehrlich et al. |
| 5,292,673 A | * | 3/1994 | Shinriki et al. |
| 5,300,187 A | | 4/1994 | Lesk et al. .................. 156/628 |
| 5,405,491 A | * | 4/1995 | Shahvandi et al. ..... 156/345.51 |
| 5,621,681 A | * | 4/1997 | Moon ......................... 257/295 |
| 5,625,217 A | * | 4/1997 | Chau et al. |
| 5,726,102 A | * | 3/1998 | Lo .............................. 430/313 |
| 5,776,356 A | | 7/1998 | Yokoyama et al. |
| 5,783,478 A | * | 7/1998 | Chau et al. |
| 6,004,850 A | | 12/1999 | Lucas et al. |
| 6,020,024 A | * | 2/2000 | Maiti et al. ............ 257/E29.16 |
| 6,037,268 A | | 3/2000 | Dautartas |
| 6,115,281 A | * | 9/2000 | Aggarwal et al. |
| 6,130,103 A | * | 10/2000 | Cuchiaro et al. |

(List continued on next page.)

FOREIGN PATENT DOCUMENTS

| | | |
|---|---|---|
| FR | 2 694 131 A1 | 1/1994 |
| JP | 53129971 | 11/1978 |
| JP | 10340893 | 12/1998 |
| JP | 2000-058515 A * | 2/2000 |
| JP | 2002075972 | 3/2002 |
| WO | WO 00/34985 | 6/2000 |

OTHER PUBLICATIONS

Anonymous, "Method for Etching of Hafnium and Zirconium Oxide Metal Layers," Research Disclosure, Jun. 1, 1989, p. 401, No. 302, Kenneth Mason Publications, Hampshire, GB.

Yue Kuo, "Anomalous High Rate Reactive Ion Etching Process for Idium Tin Oxide," Japanese Journal of Applied Physics, May 15, 1997, pp. L629–L631, vol. 36 No. 5B, Publication Office Japanese Journal of Applied Physics, Tokyo.

T. Kanniainen et al., "Growth of Dielectric $HfO_2/TA_2O_5$ Thin Film Nanolaminate Capacitors by Atomic Layer Epitaxy," Electrochemical Society Proceedings, Aug. 31, 1997, pp. 36–46, vol. 97–31, Electrochemical Society, New Jersey.

*Primary Examiner*—George Fourson
*Assistant Examiner*—Fernando Toledo
(74) *Attorney, Agent, or Firm*—James L. Clingan, Jr.; Kim-Marie Vo

(57) ABSTRACT

A metal oxide, utilized as a gate dielectric, is removed using a combination of gaseous HCl (HCl), heat, and an absence of rf. The metal oxide, which is preferably hafnium oxide, is effectively removed in the areas not under the gate electrode. The use of HCl results in the interfacial oxide that underlies the metal oxide not being removed. The interfacial is removed to eliminate the metal and is replaced by another interfacial oxide layer. The subsequent implant steps are thus through just an interfacial oxide and not through a metal oxide. Thus, the problems associated with implanting through a metal oxide are avoided.

27 Claims, 3 Drawing Sheets

U.S. PATENT DOCUMENTS

| | | | |
|---|---|---|---|
| 6,144,057 A | * 11/2000 | Yamazaki | |
| 6,162,738 A | 12/2000 | Chen et al. | |
| 6,165,375 A | * 12/2000 | Yang et al. | 216/67 |
| 6,165,802 A | * 12/2000 | Cuchiaro et al. | |
| 6,171,934 B1 | * 1/2001 | Joshi et al. | |
| 6,197,642 B1 | * 3/2001 | Yeh et al. | 257/E29.158 |
| 6,203,613 B1 | * 3/2001 | Gates et al. | |
| 6,204,130 B1 | * 3/2001 | Gardner et al. | |
| 6,204,203 B1 | * 3/2001 | Narwankar et al. | |
| 6,222,240 B1 | * 4/2001 | Gardner et al. | |
| 6,232,209 B1 | * 5/2001 | Fujiwara et al. | 438/585 |
| 6,242,350 B1 | * 6/2001 | Tao et al. | 134/1.2 |
| 6,291,867 B1 | * 9/2001 | Wallace et al. | 257/310 |
| 6,294,820 B1 | * 9/2001 | Lucas et al. | 257/412 |
| 6,300,202 B1 | * 10/2001 | Hobbs et al. | 438/287 |
| 6,348,386 B1 | * 2/2002 | Gilmer | 438/288 |
| 6,383,873 B1 | * 5/2002 | Hegde et al. | 438/287 |
| 6,403,432 B1 | * 6/2002 | Yu et al. | 438/296 |
| 6,413,829 B1 | * 7/2002 | Yu | 257/347 |
| 6,465,853 B1 | * 10/2002 | Hobbs et al. | 257/410 |
| 6,486,080 B2 | * 11/2002 | Chooi et al. | 438/785 |
| 6,495,436 B2 | * 12/2002 | Ahn et al. | 438/591 |
| 6,495,890 B1 | * 12/2002 | Ono | 257/387 |
| 6,514,828 B2 | * 2/2003 | Ahn et al. | 438/297 |

* cited by examiner

SELECTIVE METAL OXIDE REMOVAL PERFORMED IN A REACTION CHAMBER IN THE ABSENCE OF RF ACTIVATION

RELATED APPLICATIONS

This application is related to the following applications that are assigned to the assignee hereof:

U.S. patent application Ser. No. 09/851,206, by Hobbs et al., entitled "Method for Making a Semiconductor Device;" and U.S. patent application Ser. No. 09/574,732, by Hobbs et al., entitled "Selective Removal of a Metal Oxide Dielectric."

BACKGROUND OF THE INVENTION

In developing high-k dielectrics for use as gate insulating layers, the most common type of such high-k dielectrics have been metal oxides. These metal oxides have a significant higher dielectric constant than the historic gate insulator of silicon oxide. In developing these metal oxides it has become a problem of doping the source/drain with implants through such metal oxides. Thus, implanting through these metal oxides has been difficult because the metal oxides absorb and impede the progress of the dopants that are being implanted. This can result in shallower source/drain regions, which is undesirable, and also in the PN junctions being less abrupt. The energy of the implant can be increased to achieve the desired depth of the source/drains but the abruptness of the PN junctions that are formed is still reduced. The disadvantage of PN junctions that are not abrupt is increased resistance of the doped region due to the larger areas of low concentration of doping and also higher current leakage. The higher current leakage may result from the depletion region extending further and enclosing more areas that have defects. Further, the metal oxide must ultimately be removed in order to make contact to the source/drains.

To overcome this disadvantage of implanting through a metal oxide, there have been attempts to remove the metal oxide prior to performing the source/drain implants. Removal of this metal oxide, however, has been very difficult to control. If the etch of the metal oxide continues for too long, the underlying interfacial oxide is removed and the underlying silicon is pitted. Thus there is a need to provide a technique for removing metal oxides that does not result in pitting this silicon substrate.

BRIEF DESCRIPTION OF THE DRAWINGS

The present invention is illustrated by way of example and not by limitation in the accompanying figures, in which like references indicate similar elements, and in which:

Shown in FIGS. 1–7 are sequential cross-sections of a portion of a semiconductor wafer according to a preferred embodiment of the invention; and Shown in FIG. 8 is an apparatus useful in performing a portion of the method used in achieving the cross-sections shown in FIGS. 1–7.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DESCRIPTION OF THE INVENTION

In an embodiment of the invention a selective removal of a metal oxide is achieved by flowing anhydrous HCl (HCl) over a metal oxide layer while it is receiving heat by radiation. The metal oxide is effectively removed while the interfacial oxide layer underlying a gate electrode is retained and protects the underlying silicon. The HCl flows across the wafer in the absence of being energized by high frequency electromagnetic waves. In this case, high frequency means radio frequency or microwave radiation and is conveniently referenced as "rf" herein.

Figure 1:
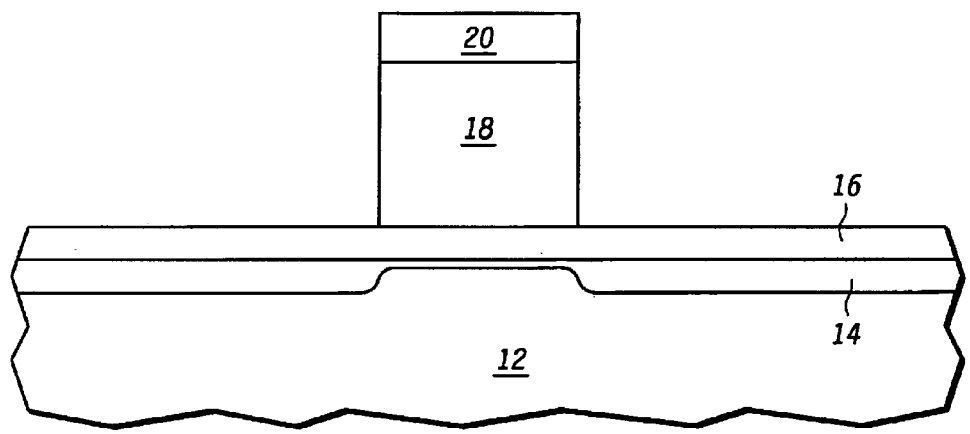

Shown in FIG. 1 is a device structure 10 comprising a silicon substrate 12, an interfacial oxide layer 14, a metal oxide layer 16, a gate electrode 18, and an antireflective coating (ARC) 20. The area immediately under gate electrode 18 is the critical area for having a high degree of coupling and is the area where it is important for the interfacial oxide layer 14 to be thin. Metal oxide layer 16 is preferably hafnium oxide and is about 30 angstroms in thickness. Gate electrode 18 may be any appropriate gate material and is preferably polysilicon. ARC 20 is any appropriate antireflective coating material and is preferably silicon-rich nitride. The interfacial oxide layer 14 is much thinner under gate electrode 18 than in source/drain areas not under gate electrode 18. Gate electrode 18 acts as a mask to oxygen and thus prevents additional growth of interfacial oxide layer 14 in the area under the gate electrode.

Figure 2:
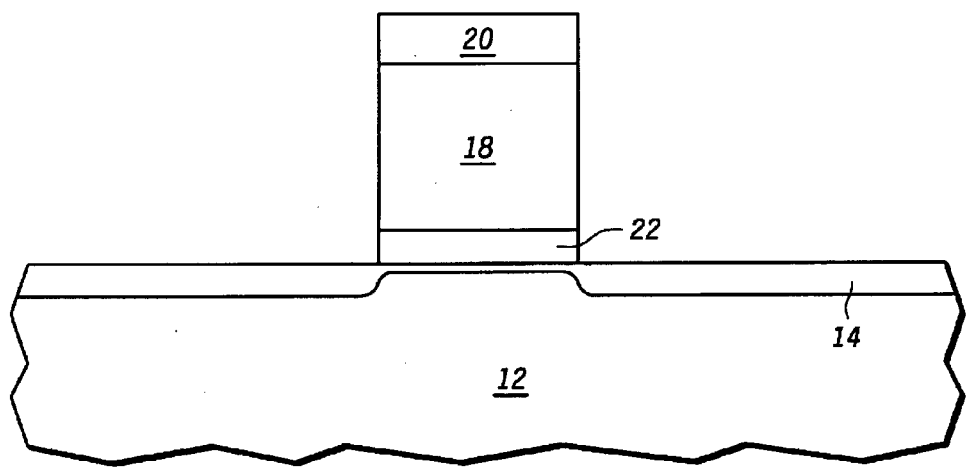

Shown in FIG. 2 is device structure 10 after removal of metal oxide 16 in areas other than those under gate electrode 18. The portion of metal oxide 16 which remains is shown as metal oxide 22 which is present only under gate electrode 18. Metal oxide 16 is selectively removed by placing it in a reaction chamber such as that shown in FIG. 8.

Figure 8:
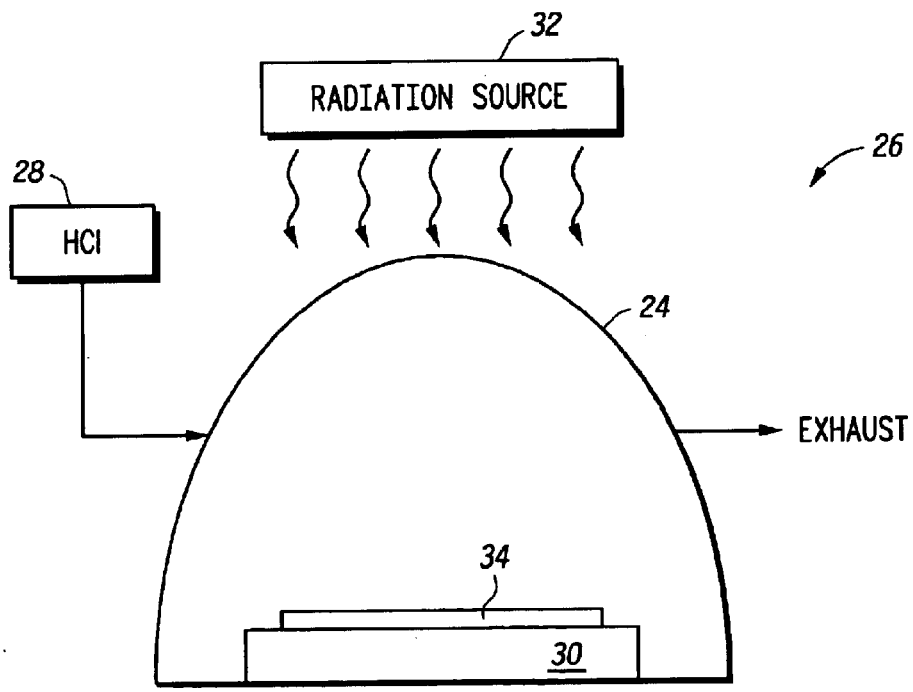

Shown in FIG. 8 is an apparatus 26 comprising a reaction chamber 24, a source of hydrogen chloride 28, a support 30, a radiation source 32, and a wafer 34 that has device structure 10 present therein. Wafer 34 is placed on support 30 and receives heat from radiation source 32. Coincident with wafer 34 receiving this radiation, HCl is flowed over wafer 34. There is no rf energy applied to the HCl. The result is the removal of the metal oxide 16 that is exposed and the retention of interfacial oxide layer 14. It has been found that an effective range of heat for wafer 34 is 600-800 degrees C. Even higher temperatures may be useful, especially with very low partial pressures of HCl. As the temperature increases to the high end of that range, there tends to be more removal of the metal oxide under gate electrode 18. This would be the type of undercutting that is commonly associated with isotropic etching. At the lower end of this range the removal of the metal oxide is slow. A good temperature that has been found to be effective in providing a good rate of removal of the metal oxide and minimal undercutting of the metal oxide under gate electrode 18 is a temperature of 650 degrees C. A good range of operation has been found to be 625-675 degrees C. The combination of the radiation and the HCl is applied for about 60 seconds at a pressure of 50 torr and at a flow rate one standard liter per minute (SLM). Also flowing with the HCl is 9 SLM of nitrogen ($N_2$), which operates as an inert gas. Other inert gases may also be effective.

Other combinations of time, temperature, pressure and flow rate may also be found to be effective for effective removal of the metal oxide without significant undercutting. In practice, the HCl is flowed prior to the application of the heat from the radiation source 32. As an alternative, heat could be achieved by convection or contact between a hot plate, for example, instead of by radiation as shown in FIG. 8. An advantage of radiation heating is that it provides for relatively faster ramp up times and ramp down times.

Figure 3:
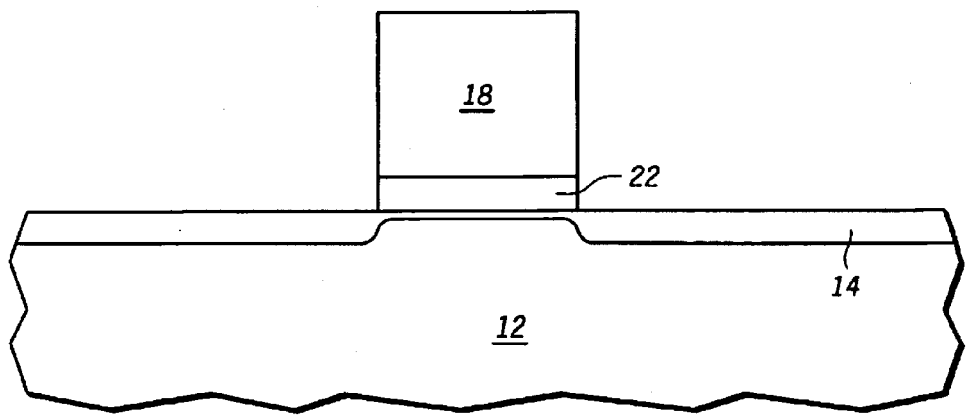

Shown in FIG. 3 is device structure 10 after removal of ARC layer 20. ARC 20 may be removed by a dry etch or a wet etch. A dry etch may result in some bombardment of the sacrificial oxide layer 14, which is exposed, and potentially even reaching the silicon of substrate 12. This possibility may be avoided by using a wet etch. Another possibility is to remove ARC 20 prior to the selective removal of metal oxide 16. Hot phosphoric acid is an effective wet etch for an ARC layer made of silicon rich silicon nitride.

Figure 4:
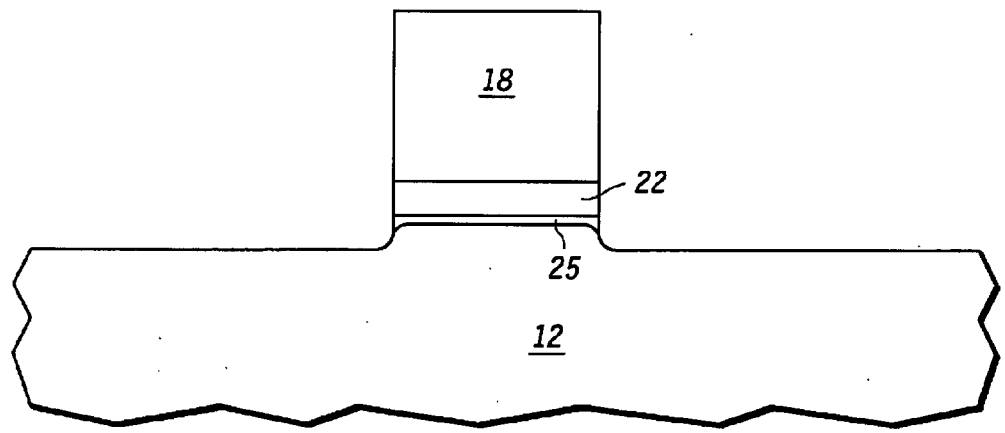
Figure 5:
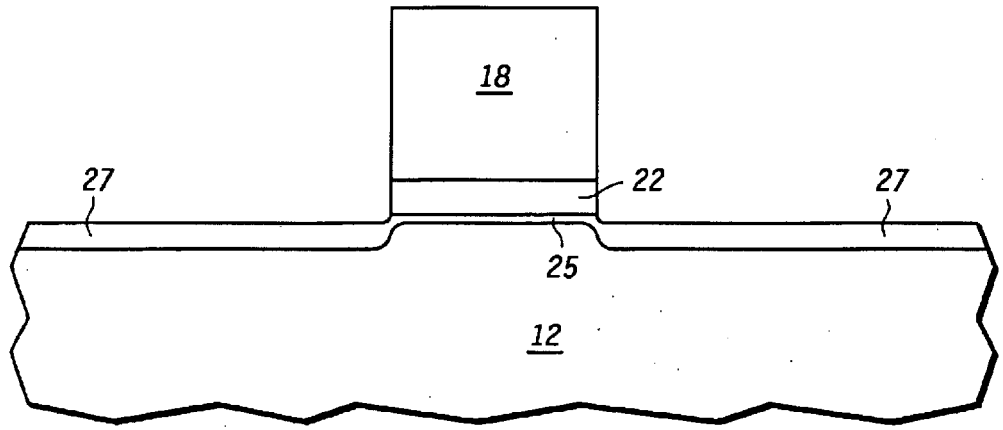

Shown in FIG. 4 is device structure 10 after a short, wet dip of device structure 10 into hydrofluoric acid (HF). The purpose of the HF dip is to clean up any accumulated metal present in interfacial oxide 14 by removing interfacial oxide 14 to leave thin interfacial oxide layer 25 under gate electrode 18. The time is about 30 seconds. The time can be adjusted according to the concentration of the HF. It should be long enough to insure the removal of the interfacial oxide layer 14 but not so long as to roughen the underlying silicon of substrate 12. The interfacial oxide layer 14 in the area that is not under gate electrode 18 is in the range of about 15–35 angstroms. After the HF dip, the device structure 10 is rinsed with de-ionized water and may be exposed to air. The result is shown in FIG. 5 with device structure 10 then having an interfacial oxide layer 27 in the area not under gate electrode 18 having a thickness in the range of about 8–15 Angstroms.

Figure 6:
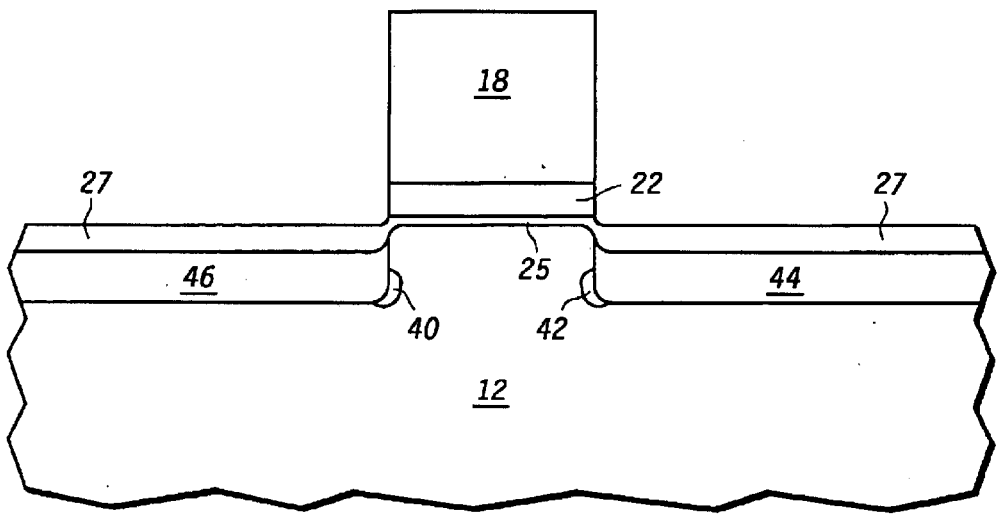

Shown in FIG. 6 is device structure 10 after two implants. One of the implants is known as a halo implant and forms regions 40 and 42. The other implants are the source drain extension implants and form source drain regions 44 and 46. Regions 44 and 46 are of the opposite conductivity type of that of substrate 12 whereas halo regions 40 and 42 are of the same conductivity type as substrate region 12. Substrate 12 is representative of either P-wells or N-wells and may be over an insulating layer as is common for substrates known as SOI. Halo regions 40 and 42 are to improve punch-through.

Figure 7:
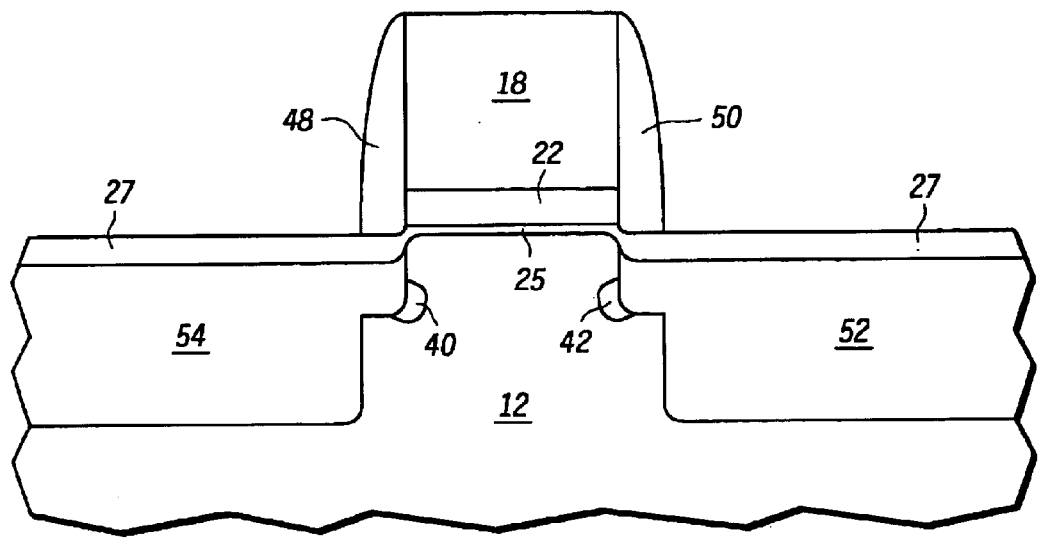

Shown in FIG. 7 is device structure 10 after formation of sidewall spacers 48 and 50 and the heavy source/drain implant. The heavy source/drain implant results in heavily doped contact regions 52 and 54. Portions of regions 52 and 54 immediately adjacent to the area immediately under gate electrode 18 are comparatively lightly doped. The doping of regions 54 and 52 is a significantly higher concentration than the doping of regions 40 and 42. Device structure 10 as shown in FIG. 7 is thus a completed transistor.

Anhydrous halides other than HCl may provide similar results. Gaseous HF for example may remove the metal oxide effectively under similar conditions. A disadvantage of HF with respect to HCl is that HF is much less selective to silicon oxide. Thus, the interfacial oxide 14, after the metal oxide was penetrated, would be removed at a greater rate with HF than it would be with HCl. Also metal fluorides are less volatile than metal chlorides which may result in less effective removal of the metal oxide. Thus, HCl is considered to be more desirable for use than gaseous HF. Other exemplary gaseous halides that may be effective are HI, HBr, $I_2$, $Br_2$, $Cl_2$, and $F_2$. Hafnium oxide has a particular advantage as a high-k dielectric as being stable with respect to polysilicon. It is less reactive with the polysilicon at the time the polysilicon is deposited compared to many other high-k dielectrics.

The absence of rf activation of the HCl has been found to be advantageous. A typical plasma etch, which uses rf, that included chlorine gases was found to pit the substrate. The pitting is believed to be a result of bombardment, physical etching as distinguished from chemical etching, of the surface by the rf-energized chlorine. The absence of the rf provides for just chemical removal of the metal oxide. This chemical removal of the present invention is believed to work by causing a reaction between the gaseous halide, preferably HCl, and the metal oxide to generate a byproduct of a portion of the HCl and the metal in the metal oxide. Also the byproduct is volatile so that it is easily removed from the reaction chamber and away from the wafer. This successful avoidance of the pitting is very beneficial because pitting can result in non-uniform implant doping, which results in increased resistance and/or other degradation in transistor performance.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a semiconductor device comprising:
   providing a semiconductor substrate;
   forming a metal oxide layer over the semiconductor substrate;
   forming a patterned gate electrode over a first portion of the metal oxide layer; and
   removing a second portion of the metal oxide layer by heating the semiconductor substrate and flowing a halide-containing species over the substrate while heating, wherein the second portion of the metal oxide layer is adjacent to the first portion of the metal oxide layer,
   wherein removing a second portion of the metal oxide layer is performed in a reaction chamber in the absence of rf activation.

2. The method of claim 1, wherein the halide-containing species further comprises hydrogen.

3. The method of claim 2, wherein the halide-containing species is HCl.

4. The method of claim 1, wherein the metal oxide layer is hafnium oxide.

5. The method of claim 1, further comprising:
   forming an patterned ARC layer over the patterned gate electrode prior to the flowing of the halide-containing species; and
   removing the patterned ARC layer after the flowing of the halide-containing species.

6. The method of claim 5, further comprising:
   forming a first interfacial oxide layer under the metal oxide layer;
   removing at least a portion of the first interfacial oxide after removing the second portion of the metal oxide layer.

7. The method of claim 6, wherein removing at least a portion of the first interfacial oxide layer is performed using a species containing hydrogen and fluorine.

8. The method of claim 7, further comprising forming a second interfacial oxide over the semiconductor substrate.

9. The method of claim 1, wherein the step of removing is further characterized as being at a temperature of between about 625 degrees Celsius to 675 degrees Celsius.

10. The method of claim 9, wherein the step of removing is further characterized as being at a pressure of about 50 torr for approximately 60 seconds and a flow rate of the halide-containing species at about one SLM.

11. The method of claim 1, wherein heating is performed using a radiation source.

12. A method of removing a metal oxide layer that is over a semiconductor substrate, comprising:
   placing the semiconductor substrate into a reaction chamber,
   heating the metal oxide layer;
   flowing, in the absence of rf activation, a chlorine-containing species while heating, wherein the chlorine-containing species reacts with a portion of the metal oxide layer to create a byproduct, wherein the byproduct comprises an element from the metal oxide layer, and
   removing the byproduct from the reaction chamber.

13. A method for forming a semiconductor device comprising:
   providing a semiconductor substrate;
   forming a metal oxide layer over the semiconductor substrate comprising hafnium and oxygen;
   removing a portion of the metal oxide layer by heating the semiconductor substrate using radiation and flowing a species containing hydrogen and chlorine;
   wherein removing a second portion of the metal oxide layer is performed in a reaction chamber in the absence of RF activation.

14. The method of claim 13, wherein heating the semiconductor substrate is at a temperature between about 625 degrees Celsius to 675 degrees Celsius.

15. The method of claim 13, wherein the semiconductor substrate comprises silicon.

16. The method of claim 15, further comprising:
   forming a first interfacial oxide layer under the metal oxide layer;
   removing at least a portion of the first interfacial oxide after removing the portion of the metal oxide layer.

17. The method of claim 16, wherein removing at least a portion of the first interfacial oxide layer is performed using a species containing hydrogen and fluorine.

18. The method of claim 17, further comprising farming a second interfacial oxide over the semiconductor substrate.

19. A method of forming a metal oxide comprising:
   providing a semiconductor substrate;
   forming a metal oxide layer over the semiconductor substrate; and
   removing a portion of the metal oxide layer by heating the semiconductor substrate and flowing a gaseous halide;
   wherein removing a portion of the metal oxide layer is performed in a reaction chamber in the absence of RP activation.

20. The method of claim 19, wherein the gaseous halide comprises hydrogen.

21. The method of claim 20, wherein the gaseous halide is HCl.

22. The method of claim 20, wherein the gaseous halide is HF.

23. The method of claim 19, wherein the metal oxide contains hafnium and oxygen.

24. The method of claim 19, wherein heating the semiconductor substrate is at a temperature between about 625 degrees Celsius to 675 degrees Celsius.

25. A method of selectively removing a metal oxide layer from a semiconductor substrate, wherein the metal oxide layer has an exposed portion and a portion under a gate electrode comprising the step of flowing gaseous HCl, in the absence of if activation, over the substrate with the substrate heated to between 600 and 800 degrees Celsius.

26. The method of claim 25, wherein the substrate is heated to between 625 and 675 degrees Celsius.

27. The method of claim 26, wherein the metal oxide is hafnium oxide.

* * * * *

UNITED STATES PATENT AND TRADEMARK OFFICE
CERTIFICATE OF CORRECTION

PATENT NO. : 6,818,493 B2  Page 1 of 1
DATED : November 16, 2004
INVENTOR(S) : Christopher C. Hobbs et al.

It is certified that error appears in the above-identified patent and that said Letters Patent is hereby corrected as shown below:

<u>Column 4,</u>
Line 40, change "if" to -- rf --.

<u>Column 6,</u>
Line 15, change "RP" to -- RF --.
Line 32, change "if" to -- rf --.

Signed and Sealed this

Twenty-fifth Day of April, 2006

JON W. DUDAS
*Director of the United States Patent and Trademark Office*